(12) United States Patent
Polzin et al.

(10) Patent No.: US 6,351,122 B1
(45) Date of Patent: *Feb. 26, 2002

(54) MRI RECONSTRUCTION USING SCAN-SPECIFIC PARTIAL ECHO AND PARTIAL NEX DATA ACQUISITIONS AND A NETWORK

(75) Inventors: Jason A. Polzin, Lake Mills, WI (US); Matthew A. Berstein, Rochester, MN (US); Thomas K. F. Foo, Rockville, MD (US)

(73) Assignee: General Electric Company, Milwaukee, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,245

(22) Filed: Dec. 27, 1999

Related U.S. Application Data

(63) Continuation-in-part of application No. 09/219,129, filed on Dec. 22, 1998, now Pat. No. 6,166,545.

(51) Int. Cl.[7] .................................................. G01V 3/00
(52) U.S. Cl. ........................ 324/309; 324/307; 324/318
(58) Field of Search ................................ 324/309, 307, 324/318

(56) References Cited

U.S. PATENT DOCUMENTS 5,321,520 A * 6/1994 Inga ........................... 358/403
6,166,545 A * 12/2000 Polzin et al. ............... 324/309
6,198,283 B1 * 3/2001 Foo et al. .................... 324/309

OTHER PUBLICATIONS

Noll, Douglas C., et al., Homodyne Detection in Magnetic Resonance Imaging, IEEE Transactions on Medical Imaging, vol. 10, No. 2, Jun. 1991, pp. 154–163.

Margosian, P., et al., Faster MR Imaging with Half the Data, Health Care Instumentation, vol. 1: pp. 195–197.

* cited by examiner

Primary Examiner—Hezron Williams
Assistant Examiner—Dixomara Vargas
(74) Attorney, Agent, or Firm—Timothy J. Ziolkowski; Michael A. Della Penna; Cook & Franke SC

(57) ABSTRACT

A method of MR imaging using fractional MRI acquisitions to reduce total acquisition time includes the steps of: obtaining a scan-specific partial MRI $k_x$ data set fraction and a scan-specific partial MRI $k_y$ data set fraction at a first location; acquiring a partial MRI $k_x$ data set in k-space along a $k_x$ direction, the partial MRI $k_x$ data set containing the scan-specific partial MRI $k_x$ data set fraction amount of direction data; acquiring a partial MRI $k_y$ data set in k-space along a $k_y$ direction, the partial MRI $k_y$ data set containing the scan-specific partial MRI $k_y$ data set faction amount of direction; reconstructing an MR image using the partial MRI $k_x$ data set and the partial MRI $k_y$ data set; and transmitting information relating to the MR image between the first location and a second location remote from the first location.

28 Claims, 7 Drawing Sheets

MRI RECONSTRUCTION USING SCAN-SPECIFIC PARTIAL ECHO AND PARTIAL NEX DATA ACQUISITIONS AND A NETWORK

CROSS-REFERENCE TO RELATED APPLICATIONS

This application is a continuation-in-part (CIP) of U.S. patent application Ser. No. 09/219,129, entitled "MRI Reconstruction Using Partial Echo And Partial NEX Data Acquisitions" by Polzin, et al. filed on Dec. 22, 1998 now issued as U.S. Pat. No. 6,166,545 Dec. 26, 2000.

BACKGROUND OF THE INVENTION

The present invention relates generally to the field of medical diagnostic systems, such as imaging systems. More particularly, the invention relates to a system and method to reconstruct a magnetic resonance (MR) image using both a partial, or fractional, $k_x$ data acquisition and a partial, or fractional $k_y$ data acquisition to reduce total acquisition scan time.

In MR imaging, to date, the scan time can be reduced by using a partial $k_x$ data set, also known as a partial echo, or a partial $k_y$ data set, also known as a partial NEX (number of excitations in ky), but not both. By acquiring a fractional echo, the echo times in MR imaging are reduced by shifting the echo formation to a time earlier in the readout window. The missing data can be reconstructed by either zero-filling along the $k_x$ direction prior to Fourier transformation, or by using a homodyne or partial k-space reconstruction technique. Under both reconstruction techniques, at least 50% of the data must be acquired. Similarly, obtaining a fractional NEX reduces the total acquisition time by acquiring either slightly more than half of the views of a full NEX to approximately three-quarters of the views of a full NEX. As in fractional echo, the missing data is either zero-filled or estimated with a homodyne or partial k-space reconstruction technique. Current methods do not allow the reconstruction of both a partial echo and a partial NEX data acquisition in the same MR image.

Therefore, it would be desirable to have a system and method capable of combining both a partial echo and a partial NEX to reduce both acquisition times and echo times in MR imaging without significant blurring effects in the resulting image.

Solutions to the problems described above have not heretofore included significant remote capabilities. In particular, communication networks, such as, the Internet or private networks, have not been used to provide remote services to such medical diagnostic systems. The advantages of remote services, such as, remote monitoring, remote system control, immediate file access from remote locations, remote file storage and archiving, remote resource pooling, remote recording, remote diagnostics, and remote high speed computations have not heretofore been employed to solve the problems discussed above.

Thus, there is a need for a medical diagnostic system which provides for the advantages of remote services and addresses the problems discussed above. In particular, there is a need for remote initiation of scans and scan-specific partial echo and partial NEX data acquisitions. Further, there is a need for remote determination of the preferred or optimum fractional part used in image acquisition of the scanned object based on a variety of factors.

SUMMARY OF THE INVENTION

One embodiment of the invention relates to a method of MR imaging using fractional MRI acquisitions to reduce total acquisition time. The method includes the steps of: obtaining a scan-specific partial MRI $k_x$ data set fraction and a scan-specific partial MRI $k_y$ data set fraction at a first location; acquiring a partial MRI $k_x$ data set in k-space along the $k_x$ direction, the partial MRI $k_x$ data set containing the scan-specific partial MRI $k_x$ data set fraction amount of direction data; acquiring a partial MRI $k_y$ data set in k-space along $k_y$ direction, the partial MRI $k_y$ data set containing the scan-specific partial MRI $k_y$ data set fraction amount of direction data; reconstructing an MR image using the partial MRI $k_x$ data set and the partial MRI $k_y$ data set; and transmitting information relating to the MR image between the first location and a second location remote from the first location.

Another embodiment of the invention relates to an MR data acquisition system designed to reduce total time in image acquisition. The system includes a magnetic resident imaging system, a network coupling the magnetic residence imaging system to a remote facility, and at least one computer coupled to the remote facility and the magnetic residence imaging system. The magnetic residence imaging system includes a plurality of gradient coils positioned about a bore of a magnetic to impress a polarizing magnetic field and a RF transceiver system and an RF modulator controlled by a post control module to transmit RF signal to a RF coil assembly to acquire MR images. The network provides remote services to the magnetic resonance imaging system. The computer is programmed to acquire a partial MR data set having data in a $k_x$ direction and data in a $k_y$ direction and having data missing in the $k_x$ direction and data missing in the $k_y$ direction based on fractional values provided by the remote facility via the network; Fourier transform the partial MR data set in the $k_x$ direction to acquire an equivalent full x set in an x direction; synthesize the partial MR data set in the $k_y$ direction using the equivalent full x data set to acquire an equivalent full x,y data set; and reconstruct an MR image using the equivalent full x,y data set.

Another embodiment of the invention relates to an MRI system for minimizing data acquisition time. The MRI system includes means for partially acquiring an MRI data set in both a $k_x$ direction and $k_y$ direction based on fractional values provided at a first location; means for interpolating the partial MRI data set in a complete $S(x, k_y)$ MRI data set in an x direction; means for symphonizing in the complete $S(x, k_y)$ data set in the $k_y$ direction into a complete x,y MRI data set; means for reconstructing an MR image using the complete x,y MR data set acquired with reduced acquisition time; and means for transmitting information relating to the MR image between the first location and a second location remote from the first location.

Other principle features and advantages of the present invention will become apparent to those skilled in the art upon review of the following drawings, the detailed description, and the appended claims.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENT

Figure 1:
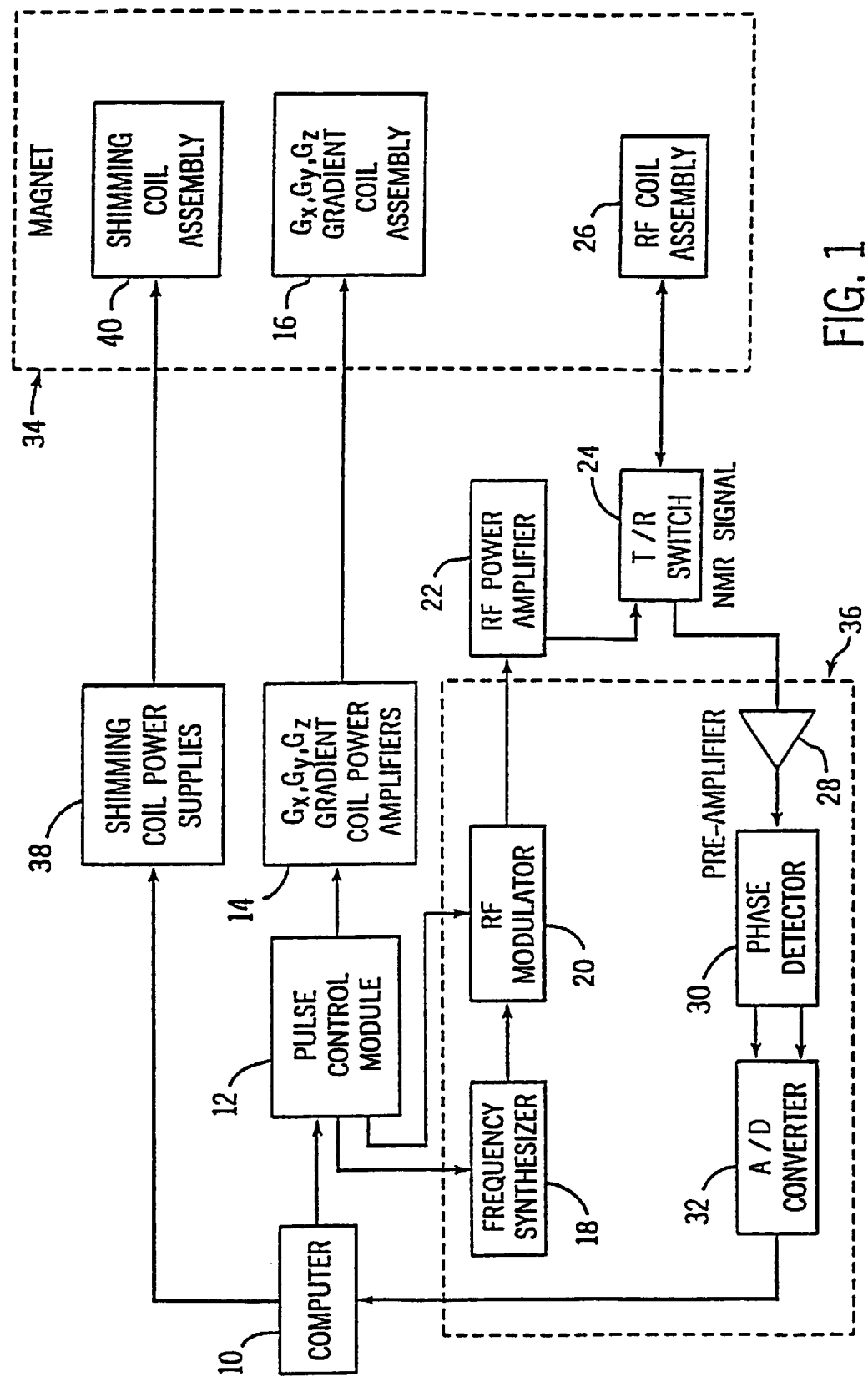
FIG. 1 is a schematic block diagram of an MR imaging system for use with the present invention.

Referring to FIG. 1, a nuclear magnetic resonance (NMR) imaging system of a type suitable for the practice of the preferred embodiment includes a computer 10 which controls gradient coil power amplifiers 14 through a pulse control module 12. The pulse control module 12 and the gradient amplifiers 14 together produce the proper gradient waveforms Gx, Gy, and Gz, for either a spin echo, a gradient recalled echo pulse sequence, a fast spin echo, or other type of pulse sequences. The gradient waveforms are connected to gradient coils 16 which are positioned around the bore of the magnet 34 so that gradients Gx, Gy, and Gz are impressed along their respective axes on the polarizing magnetic field Bo from magnet 34.

The pulse control module 12 also controls a radio frequency synthesizer 18 which is part of an RF transceiver system, portions of which are enclosed by dashed line block 36. The pulse control module 12 also controls an RF modulator 20 which modulates the output of the radio frequency synthesizer 18. The resultant RF signals, amplified by power amplifier 22 and applied to RF coil 26 through transmit/receive switch 24, are used to excite the nuclear spins of the imaged object (not shown).

The NMR signals from the excited nuclei of the imaged object are picked up by the RF coil 26 and presented to preamplifier 28 through transmit/receive switch 24, to be amplified and then processed by a quadrature phase detector 30. The detected signals are digitized by a high speed A/D converter 32 and applied to computer 10 for processing to produce NMR images of the object. Computer 10 also controls shimming coil power supplies 38 to power shimming coil assembly 40.

The presently preferred embodiment includes a method and system suitable for use with the above-referenced NMR system, or any similar or equivalent system for obtaining MR k-space data for use in reconstructing MR images.

The presently preferred embodiment includes initiating an MRI scan to acquire MRI data and acquiring a partial or fractional echo and a partial or fractional NEX. The partial echo is a partial MRI $k_x$ data set acquired in k-space along a $k_x$ direction. The partial MRI $k_x$ data set must contain at least 50% of the $k_x$ data. The partial NEX includes acquiring a partial MRI $k_y$ data set in k-space along a $k_y$ direction. The partial MRI $k_y$ data set also must contain at least 50% of the data in the $k_y$ direction. Once the partial echo and a partial NEX are acquired, an MRI image can be reconstructed by first zero-filling the missing data in the $k_x$ direction by using the acquired partial MRI $k_x$ data set, Fourier transforming the partial $k_x$ data set into a full x data set, and then the missing data in the $k_y$ direction can be synthesized by using the acquired data in the $k_x$ direction along with the zero-filled data, as will be described in further detail hereinafter.

Figure 2:
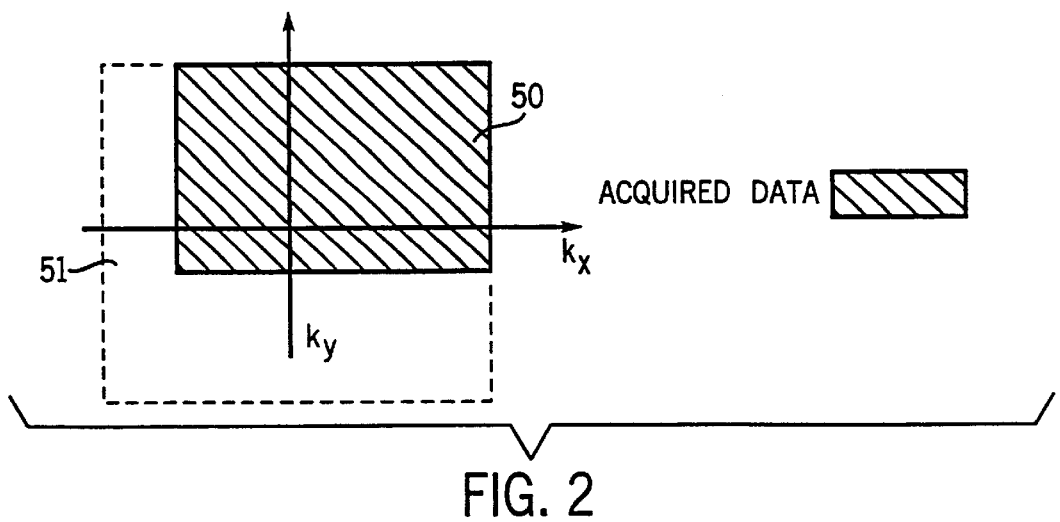
FIG. 2 is a graphical representation of a partially acquired data set in k-space.

Referring to FIG. 2, a graphical representation of a partial MRI data set 50. For illustrative purposes, the larger area 51 shows what would be a complete MRI data set if full echo and full NEX scans were acquired along the $k_x$ direction and the $k_y$ direction. Therefore, the acquired partial MRI data set 50 has data lying between $-k_{x0} < k_x < k_{xmax}$ and $-k_{y0} < k_{ymax}$. From this generalized description, an MR image can be reconstructed according to the following steps.

Figure 3:
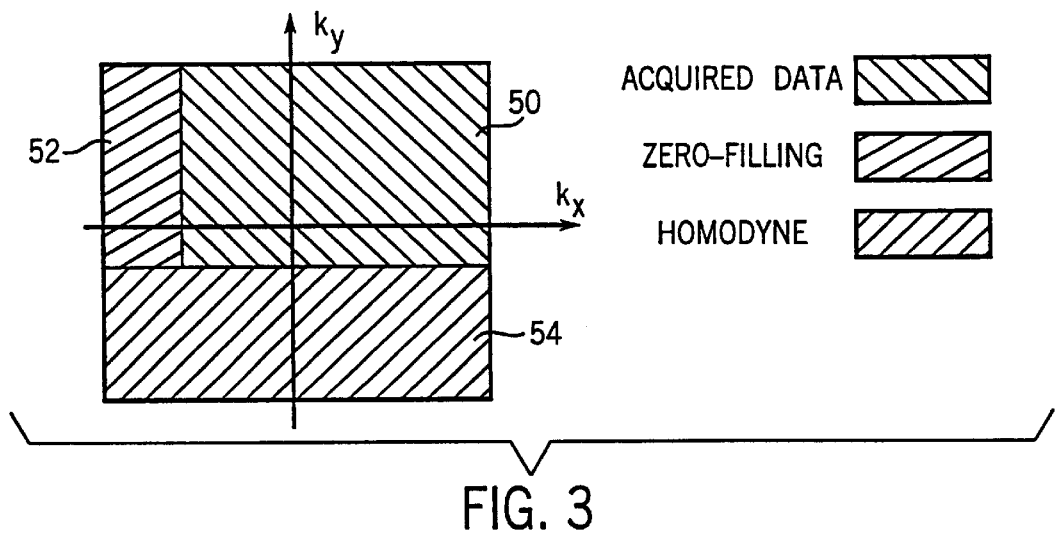
FIG. 3 is a graphical representation of the partially acquired data of FIG. 2, along with reconstructed data in k-space.

Referring to FIG. 3, once the partial MRI data 50 is acquired in the $k_x$ and $k_y$ directions, via a partial or fractional echo and a partial or fractional NEX, the missing data in the $-k_x$ direction can be reconstructed or synthesized. To reconstruct the missing $-k_x$ data, a procedure known as zero-filling is used along the frequency encoding direction $k_x$. For example, the missing k-space data values that are in the set $-k_{xmax} < k_x < -k_{x0}$ are assigned zero values. The resulting data is nearly equivalent to the full $k_x$ data set, which is referred to as $S(k_x, k_y)$ in k-space, multiplied by the step function $u(k_x + k_{x0})$, resulting in:

$$S(k_x, k_y) = S'(k_x, k_y)\, u(k_x + k_{x0}). \qquad [1]$$

Next, a Fermi window is applied to the $S(k_x, k_y)$ data along the frequency encoding direction, $k_x$, to smooth the data transition region about $-k_{x0}$, in order to reduce truncation artifacts, which can result in ringing in the resulting image. The Fermi-windowed data is Fourier transformed along the frequency encoding direction, $k_x$. That is, the zero-filled data, $S'(k_x, k_y)$, is Fourier transformed along $k_x$ resulting in $S'(x, k_y)$ which is equivalent to:

$$S'(x,k_y) = S'(x,k_y) \otimes FT^{-1}(u(k_x+k_{x0})). \qquad [2]$$

Because the convolution term in Eqn. [2] results in blurring along the x direction, there is a trade-off between obtaining high quality images and reducing the total acquisition time for the MR image. That is, to obtain a relatively high quality image and reduce the blurring along the x direction, it is necessary to have a high echo fraction. However, the higher the echo fraction, the longer the MR data acquisition time. It has been found in the preferred embodiment, that an echo fraction of approximately 80% provides acceptable high quality images.

The Fourier transformed data, $S'(x,k_y)$ is identical to transformed full echo, fractional NEX data, with additional blurring along the x direction that is associated with the zero-filling. According to the present invention, the next step is to perform fractional NEX homodyne processing along the $k_y$ direction.

The following is a review of an acceptable homodyne method. In general, the synthesis of the missing k-space data assumes that the MR data is Hermitian for a real-valued image. That is:

$$F(-k_x) = F^*(k_x) \qquad [3]$$

where the * denotes a complex conjugate. If the k-space is divided into 4 quadrants, the data for at least two of the four quadrants is needed in order to generate an image.

The following background is a review of the prior art homodyne method. If f(x) is the real-valued image and $\phi(x)$ is the spatially varying phase in the image, the expression for the complex valued image can be written as:

$$I(x)=f(x) \exp(j\phi(x))=f_L(x) \exp(j\phi_L(x))+f_H(x) \exp(j\phi_H(x)), \text{ where } j=\sqrt{-1}. \quad [4]$$

This expression is a linear combination of the Fourier transforms of the low-pass and high-pass filtered k-space data, respectively. In homodyne reconstruction, the phase is assumed to be slowly varying and that $\phi_L(x) \approx \phi_H(x)$. Therefore, if only one-half of the high-pass filtered data is available, this is equivalent to multiplying the high-pass filtered data by a Heaviside function such that the resulting image is given by:

$$I_H(x) = f_L(x)\exp(j\phi_L(x)) + f_H(x)\exp(j\phi_L(x)) \otimes \frac{1}{2}\left(\delta(x) + \frac{1}{j\pi x}\right), \quad [5]$$

where $\otimes$ denotes a convolution. Since the convolution term decays with 1/x and that the phase is slowly varying, Eqn. [5] can be rewritten as:

$$I_H(x) \approx \left(f_L(x) + \frac{1}{2}f_H(x) - \frac{j}{2}f_H(x) \otimes \frac{1}{\pi x}\right)\exp(j\phi_L(x)). \quad [6]$$

If the available high frequency data is weighted by 2, Eqn. [6] can be written as:

$$I_H(x) = \left(f_L(x) + f_H(x) - jf_H(x) \otimes \frac{1}{\pi x}\right)\exp(j\phi_L(x)). \quad [7]$$

If the spatially varying phase term is divided out, the image is then the real-valued part of $I_H(x)\exp(-j\phi_L(x))$, i.e.:

$$f_L(x)+f_H(x)=f(x)=\text{Re}(I_H(x)\exp(-j\phi_L(x))), \quad [8]$$

where the spatially varying phase is estimated from the phase of the Fourier transform of the low-pass filtered data. It is noted that in Eqn. [8], all phase information has now been lost. Note that Eqn. [8] could easily be written as $f(x)=\text{Re}(I_H(x))e^{-j\phi_L(x)}$ where the phase in the image is the low spatial frequency phase. However, this phase is only an estimate and is of little use. Hence, this technique is not suitable for phase contrast reconstruction. Furthermore, the loss of phase information requires that the Fourier transform in the x direction be performed first, before the homodyne reconstruction is applied to the data in the y direction.

Accordingly, as shown in FIG. 3, the data reconstructed in the $k_x$ direction by zero-filling is depicted as reconstructed zero-filled data section 52, and once there is complete data, 50, 52 along the $k_x$ direction, then the homodyne processing can be performed to acquire or synthesize the missing data in the $k_y$ direction to acquire a complete data set in the $k_y$ direction, including the homodyne reconstructed data section 54.

Figure 4:
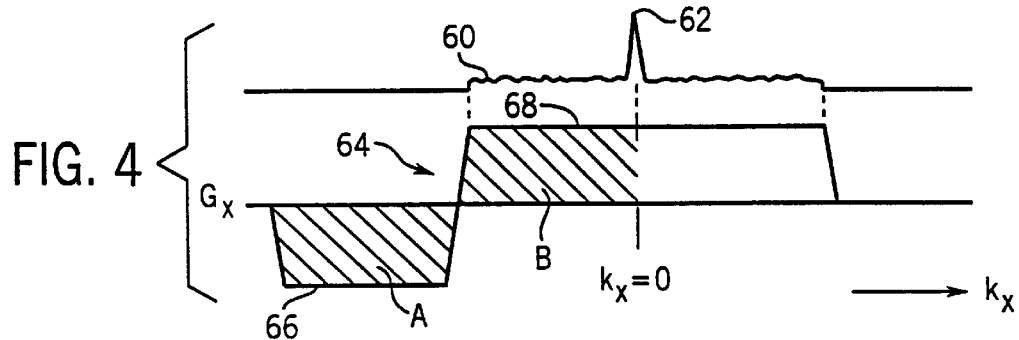
FIG. 4 is a graph of an echo signal and a dephasing and a rephasing gradient representation for a full MRI data acquisition.
Figure 5:
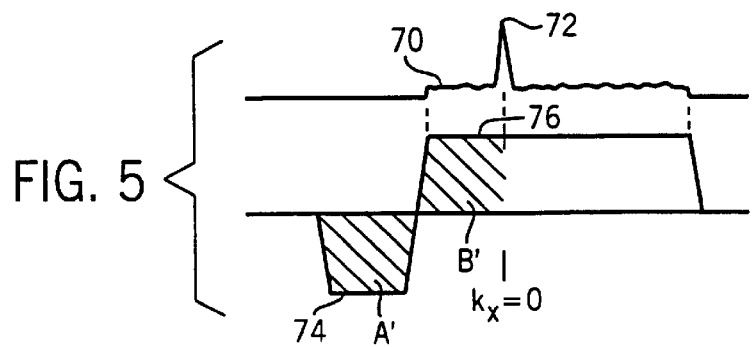
FIG. 5 is a graph of an echo signal and a dephasing and rephasing gradient representation for a partially acquired data set according to the present invention.

Referring to FIG. 4, a typical, data acquisition is shown is which an echo pulse 60, having an echo peak 62 is shown above a gradient signal 64. The gradient signal includes a dephasing gradient 66 and a rephasing gradient 68. As is known, in order to obtain the desired rephasing gradient, a dephasing gradient of approximately same gradient area as the desired rephasing gradient (measured from the start of the gradient to the echo peak) is required during which the spins are wound in the negative direction. As shown in FIG. 5, with the present invention, the necessary data acquisition is acquired with significant reduced acquisition time. The echo pulse 70 with echo peak 72, is produced with a reduced pulse width dephasing gradient area 74, and thus a reduced rephasing gradient area 76. This results in less acquisition time to acquire the reduced $k_x$ points. That is, the reduced number of $k_x$ points acquired in the $-k_x$ space, results in the minimization of echo time (TE). Since echo time (TE) is determined by the time between the peak of the RF pulse and the peak of the echo 62, 72, it is evident that reducing the $k_x$ points to the left of $k_x=0$ will reduce the TE time.

Comparing FIGS. 4 and 5, the area of gradient A, the negative gradient area 66 is equal to the area of gradient B, the positive gradient 68. By making a reduction in the $k_x$ points acquired, the area of gradient A', FIG. 5, is reduced and therefore the area of gradient B' is equally reduced since the area of the positive gradient is equal to the area of the negative gradient and the TE time savings is thereby amplified.

Figure 6:
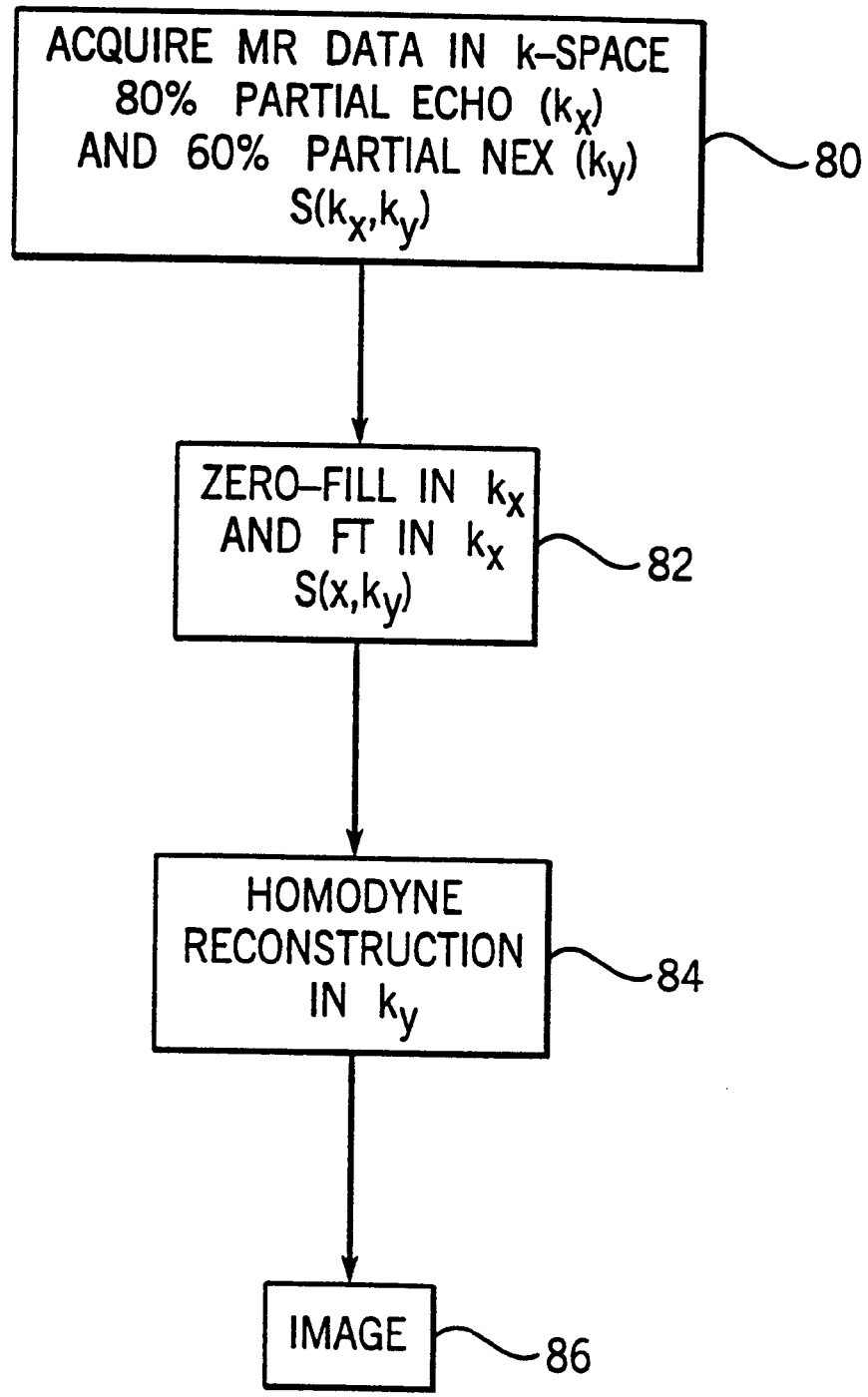
FIG. 6 is a flow chart depicting the system and method of the present invention.

Referring to FIG. 6, the steps of the present invention are disclosed in flow chart form, which can also be used in programming the computer 10 of FIG. 1 to acquire a MR data acquisition system designed to reduce total echo and acquisition. The computer includes a means to partially acquire an MRI data set in both a $k_x$ direction and the $k_y$ direction 80. The partial MRI data set has data present in the $k_x$ direction and in the $k_y$ direction and has data missing in the $k_x$ direction and the $k_y$ direction. Preferably, an 80% partial echo is taken in the $k_x$ direction and a 60% partial NEX in the $k_y$ direction. The resulting data is in the k-space domain and is referred to as $S(k_x, k_y)$.

The MRI system also includes a means for interpolating the partial MRI data set into a complete $k_x$ MRI data set in the $k_x$ direction. Such a means for interpolating includes zero-filling data in the $k_x$ direction and taking a Fourier transform in $k_x$ to acquire an equivalent full $k_x$ data set in an x direction 82. The resulting data is now in the time domain in the x direction and in the frequency domain in the $k_y$ direction and can be expressed as $S(x, k_y)$.

The MRI system according to the present invention is then programmed to synthesize the partial MR data set in the $k_y$ direction via a means for synthesizing the $S(x, k_y)$ MRI data in the $k_y$ direction 84. In the preferred embodiment, the synthesizing is accomplished by homodyne processing the $S(x, k_y)$ data set as previously set forth.

The MRI system also includes a means for reconstructing an MR image using the interpolated and synthesized complete x,y MRI data set, as shown in FIG. 3, to produce an image 86, FIG. 6, in a reduced total time while any blurring effects are minimized by acquiring at least an 80% echo and a 60% NEX.

It is understood that a lower limit for the data acquisitions may be acceptable depending upon the object being imaged. Further, in the preferred embodiment the data is synthesized or reconstructed in the $k_x$ direction first to acquire a full $k_x$ data set, and then synthesized in the $k_y$ direction by homodyne reconstruction. This sequential operation is necessary because in homodyne reconstruction the phase of the data is lost and cannot be expected to be used to reconstruct data in the $k_x$ direction.

The foregoing description is based on a two-dimensional model for the present invention. However, it is contemplated that the presently preferred embodiment can be extended into multiple dimensions, such as three-dimensional and above. As previously described, in order to reconstruct data in two or more dimensions, the phase must be preserved after the reconstruction of the first dimension. In the preferred embodiment, it was noted that zero-filling prior to a Fourier transform will preserve phase information in a partial data acquisition in k-space reconstruction. Since the homodyne method of partial k-space reconstruction results in data with all phase information lost, subsequent data reconstructions are not possible. Therefore, any step using the homodyne method will be the terminal step.

In general terms then, for multi-dimensional partial k-space data of n-dimensions, the data reconstruction of the (n–1) dimensions is preferably by the zero-filling technique, with the subsequent, nth dimension reconstructed using the homodyne method. Therefore, the presently preferred embodiment includes a method of additionally acquiring a partial MRI $k_z$ data set in k-space along a $k_z$ direction. The partial MRI $k_z$ data set would preferably contain less than 100% of $k_z$ direction data but preferably more than 50% of the possible $k_z$ direction data. It is understood that the notation $k_z$ can refer to any dimension and the process is applicable to any number of dimensions. The method further includes reconstructing an MR image using the partial $k_x$ data set, the partial $k_y$ data set, and the partial $k_z$ data set, and any other dimensional data set desirable. As will be well understood by those skilled in the art, the multi-dimensional extension of the presently preferred embodiment is readily programmable and adaptable to the aforementioned computer system.

Figure 7:
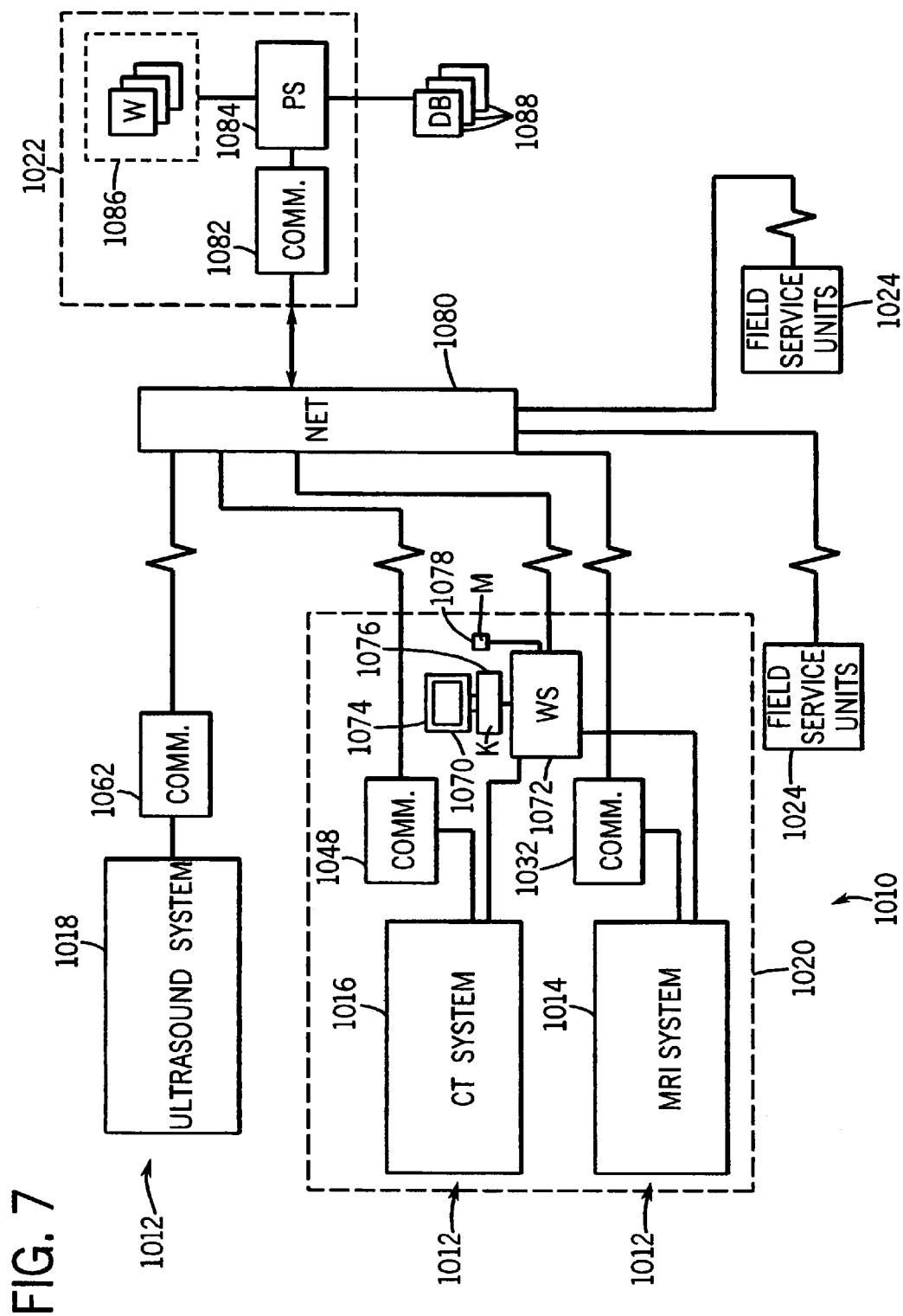
FIG. 7 is a diagrammatical representation of a series of medical diagnostic systems coupled to a service facility via a network connection for providing remote services and data interchange between the diagnostic systems and the service facility.

Referring now to FIG. 7, a service system 1010 is illustrated for providing remote service to a plurality of medical diagnostic systems 1012, including systems such as the MR imaging system described with reference to FIG. 1. In the embodiment illustrated in FIG. 7, the medical diagnostic systems include a magnetic resonance imaging (MRI) system 1014, a computed tomography (CT) system 1016, and an ultrasound imaging system 1018. The diagnostic systems may be positioned in a single location or facility, such as a medical facility 1020, or may be remote from one another as shown in the case of ultrasound system 1018. The diagnostic systems are serviced from a centralized service facility 1022. Moreover, a plurality of field service units 1024 may be coupled in the service system for transmitting service requests, verifying service status, transmitting service data and so forth as described more fully below.

In the exemplary embodiment of FIG. 7, several different system modalities are provided with remote service by the service facility. Remote services include but are not limited to services, such as, remote monitoring, remote system control, immediate file access from remote locations, remote file storage and archiving, remote resource pooling, remote recording, and remote high speed computations. Remote services are provided to a particular modality depending upon the capabilities of the service facility, the types of diagnostic systems subscribing to service contracts with the facility, as well as other factors.

Depending upon the modality of the systems, various subcomponents or subsystems will be included. MRI system 1014 includes a uniform platform for interactively exchanging service requests, messages and data with service facility 1022 as described more fully below. MRI system 1014 is linked to a communications module 1032, which may be included in a single or separate physical package from MRI system 1014. In a typical system, additional components may be included in system 1014, such as a printer or photographic system for producing reconstructed images based upon data collected from the scanner.

Similarly, CT system 1016 will typically include a scanner, a signal acquisition unit, and a system controller. The scanner detects portions of x-ray radiation directed through a subject of interest. The controller includes circuitry for commanding operation of the scanner and for processing and reconstructing image data based upon the acquired signals. CT system 1016 is linked to a communications module 1048 for transmitting and receiving data for remote services. Moreover, like MRI system 1014, CT system 1016 will generally include a printer or similar device for outputting reconstructed images based upon data collected by the scanner.

In the case of ultrasound system 1018, such systems will generally include a scanner and data processing unit and a system controller. Ultrasound system 1018 is coupled to a communications module 1062 for transmitting service requests, messages and data between ultrasound system 1018 and service facility 1022.

Although reference is made herein generally to "scanners" in diagnostic systems, that term should be understood to include medical diagnostic data acquisition equipment generally, not limited to image data acquisition, as well as to picture archiving communications and retrieval systems, image management systems, facility or institution management systems, viewing systems and the like, in the field of medical diagnostics.

Where more than one medical diagnostic system is provided in a single facility or location, as indicated in the case of MRI and CT systems 1014 and 1016 in FIG. 7, these may be coupled to a management station 1070, such as in a radiology department of a hospital or clinic. The management station may be linked directly to controllers for the various diagnostic systems. The management system may include a computer workstation or personal computer 1072 coupled to the system controllers in an intranet configuration, in a file sharing configuration, a client/server arrangement, or in any other suitable manner. Moreover, management station 1070 will typically include a monitor 1074 for viewing system operational parameters, analyzing system utilization, and exchanging service requests and data between the facility 1020 and the service facility 1022. Input devices, such as a standard computer keyboard 1076 and mouse 1078, may also be provided to facilitate the user interface.

It should be noted that, alternatively, the management system, or other diagnostic system components, may be "stand-alone" or not coupled directly to a diagnostic system. In such cases, the service platform described herein, and some or all of the service functionality nevertheless be provided on the management system. Similarly, in certain applications, a diagnostic system may consist of a stand-alone or networked picture archiving communications and retrieval system or a viewing station provided with some or all of the functionality described herein.

The communication modules mentioned above, as well as workstation 1072 and field service units 1024 may be linked to service facility 1022 via a remote access network 1080. For this purpose, any suitable network connection may be employed. Presently preferred network configurations include both proprietary or dedicated networks, as well as open networks, such as the Internet. Data may be exchanged between the diagnostic systems, field service units, and remote service facility 1022 in any suitable format, such as in accordance with the Internet Protocol (IP), the Transmission Control Protocol (TCP), or other known protocols. Moreover, certain of the data may be transmitted or formatted via markup languages such as the HyperText Markup Language (HTML), or other standard languages. The presently preferred interface structures and communications components are described in greater detail below.

Within service facility 1022, messages, service requests and data are received by communication components as indicated generally at reference numeral 1082. Components 1082 transmit the service data to a service center processing system, represented generally at reference numeral 1084 in FIG. 7. The processing system manages the receipt, handling and transmission of service data to and from the service facility. In general, processing system 1084 may include one or a plurality of computers, as well as dedicated hardware or software servers for processing the various service requests and for receiving and transmitting the service data as described more fully below.

Service facility 1022 also includes a bank of operator workstations 1086 which may be staffed by personnel who address the service requests and provide off and on-line service to the diagnostic systems in response to the service requests. Also, processing system 1084 may be linked to a system of databases or other processing systems 1088 at or remote from the service facility 1022. Such databases and processing systems may include extensive database information on operating parameters, service histories, and so forth, both for particular subscribing scanners, as well as for extended populations of diagnostic equipment.

Figure 8:
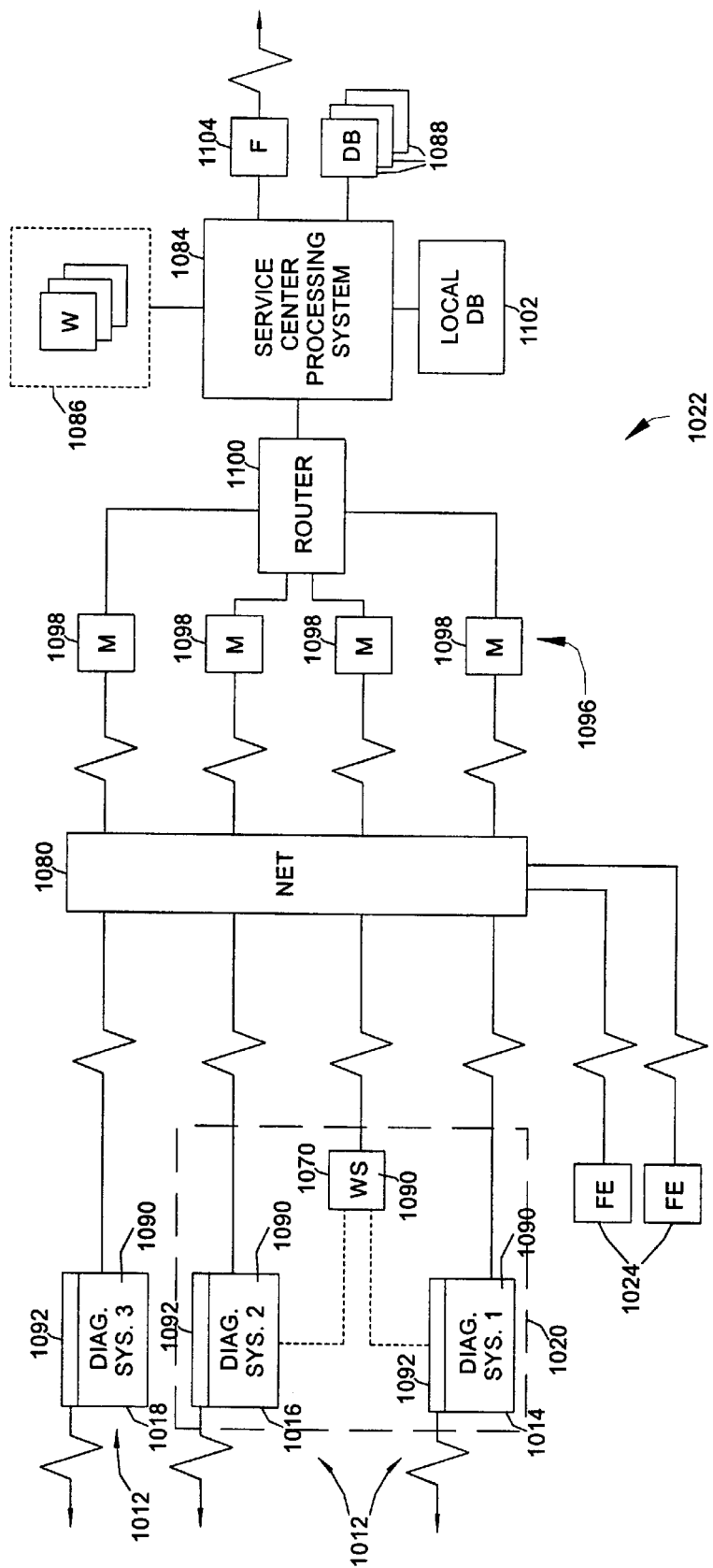
FIG. 8 is a block diagram of the systems shown in FIG. 7 illustrating certain functional components of the diagnostic systems and the service facility.

FIG. 8 is a block diagram illustrating the foregoing system components in a functional view. As shown in FIG. 8, the field service units 1024 and the diagnostic systems 1012 can be linked to the service facility 1022 via a network connection as illustrated generally at reference numeral 1080. Within each diagnostic system 1012, a uniform service platform 1090 is provided.

Platform 1090, which is described in greater detail below with particular reference to FIG. 9, includes hardware, firmware, and software components adapted for composing service requests, transmitting and receiving service data, establishing network connections and managing financial or subscriber arrangements between diagnostic systems and the service facility. Moreover, the platforms provide a uniform graphical user interface at each diagnostic system, which can be adapted to various system modalities to facilitate interaction of clinicians and radiologists with the various diagnostic systems for service functions. The platforms enable the scanner designer to interface directly with the control circuitry of the individual scanners, as well as with memory devices at the scanners, to access image, log and similar files needed for rendering requested or subscribed services. Where a management station 1070 is provided, a similar uniform platform is preferably loaded on the management station to facilitate direct interfacing between the management station and the service facility. In addition to the uniform service platform 1090, each diagnostic system is preferably provided with an alternative communications module 1092, such as a facsimile transmission module for sending and receiving facsimile messages between the scanner and remote service facilities.

Messages and data transmitted between the diagnostic systems and the service facility traverse a security barrier or "firewall" contained within processing system 1084 as discussed below, which prevents unauthorized access to the service facility in a manner generally known in the art. A modem rack 1096, including a series of modems 1098, receives the incoming data, and transmits outgoing data through a router 1100 which manages data traffic between the modems and the service center processing system 1084.

In the diagram of FIG. 8, operator workstations 1086 are coupled to the processing system, as are remote databases or computers 1088. In addition, at least one local service database 1102 is provided for verifying license and contract arrangements, storing service record files, log files, and so forth. Moreover, one or more communication modules 1104 are linked to processing system 1084 to send and receive facsimile transmissions between the service facility and the diagnostic systems or field service units.

Figure 9:
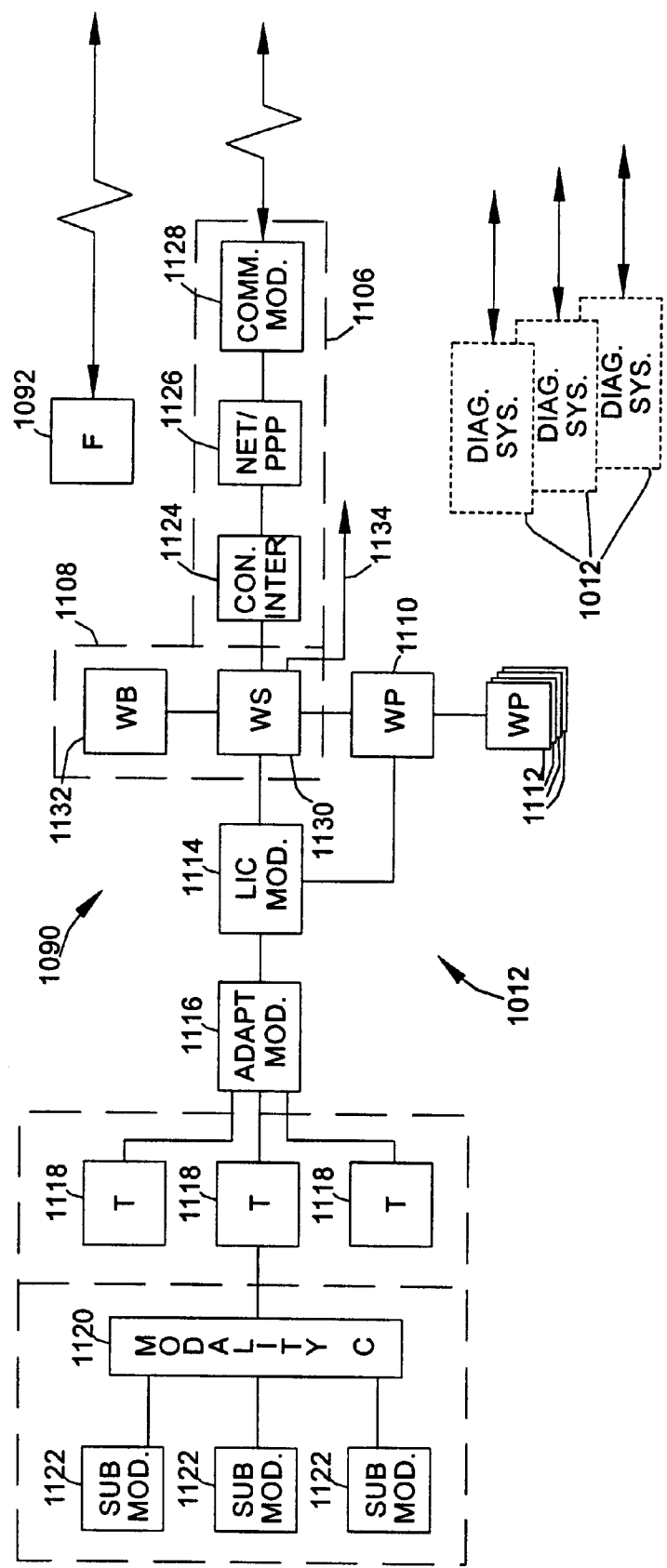
FIG. 9 is a block diagram of certain functional components within a diagnostic system of the type shown in FIGS. 7 and 8 for facilitating interactive remote servicing of the diagnostic system.

FIG. 9 illustrates diagrammatically the various functional components comprising the uniform service platform 1090 within each diagnostic system 1012. As shown in FIG. 9, the uniform platform includes a device connectivity module 1106, as well as a network connectivity module 1108. Network connectivity module 108 accesses a main web page 110 which, as mentioned above, is preferably a markup language page, such as an HTML page displayed for the system user on a monitor at the diagnostic system. Main web page 1110 is preferably accessible from a normal operating page in which the user will configure examination requests, view the results of examinations, and so forth such as via an on-screen icon. Through main web page 1110, a series of additional web pages 1112 are accessible. Such web pages permit remote service requests to be composed and transmitted to the remote service facility, and facilitate the exchange of other messages, reports, software, protocols, and so forth as described more fully below.

It should be noted that as used herein the term "page" includes a user interface screen or similar arrangement which can be viewed by a user of the diagnostic system, such as screens providing graphical or textual representations of data, messages, reports and so forth. Moreover, such pages may be defined by a markup language or a programming language such as Java, perl, java script, or any other suitable language.

Network connectivity module 1108 is coupled to a license module 1114 for verifying the status of license, fee or contractual subscriptions between the diagnostic system and the service facility. As used herein, the term "subscription" should be understood to include various arrangements, contractual, commercial or otherwise for the provision of services, information, software, and the like, both accompanies with or without payment of a fee. Moreover, the particular arrangements manages by systems as described below may include several different types of subscriptions, including time-expiring arrangements, one-time fee arrangements, and so-called "pay per use" arrangements, to mention but a few.

License module 1114 is, in turn, coupled to one or more adapter utilities 1116 for interfacing the browser, server, and communications components with modality interface tools 1118. In a presently preferred configuration, several such interface tools are provided for exchanging data between the system scanner and the service platform. For example, modality interface tools 1118 may include applets or servlets for building modality-specific applications, as well as configuration templates, graphical user interface customization code, and so forth. Adapters 1116 may interact with such components, or directly with a modality controller 1120 which is coupled to modality-specific subcomponents 1122.

The modality controller 1120 and modality-specific subcomponents 1122 will typically include a preconfigured processor or computer for executing examinations, and memory circuitry for storing image data files, log files, error files, and so forth. Adapter 1116 may interface with such circuitry to convert the stored data to and from desired protocols, such as between the HyperText Transfer Protocol (HTTP) and DICOM, a medical imaging standard for data presentation. Moreover, transfer of files and data as described below may be performed via any suitable protocol, such as a file transfer protocol (FTP) or other network protocol.

In the illustrated embodiment, device connectivity module 1106 includes several components for providing data exchange between the diagnostic system and the remote service facility. In particular, a connectivity service module 1124 provides for interfacing with network connectivity module 1108. A Point-to-Point Protocol (PPP) module 1126 is also provided for transmitting Internet Protocol (IP) packets over remote communication connections. Finally, a modem 1128 is provided for receiving and transmitting data between the diagnostic system and the remote service facility. As will be appreciated by those skilled in the art, various other network protocols and components may be employed within device connectivity module 1106 for facilitating such data exchange.

Network connectivity module 1108 preferably includes a server 1130 and a browser 1132. Server 1130 facilitates data exchange between the diagnostic system and the service facility, and permits a series of web pages 1110 and 1112 to be viewed via browser 1132. In a presently preferred embodiment, server 1130 and browser 1132 support HTTP applications and the browser supports java applications. Other servers and browsers, or similar software packages may, of course, be employed for exchanging data, service requests, messages, and software between the diagnostic system, the operator and the remote service facility. Finally, a direct network connection 1134 may be provided between server 1130 and an operator workstation, such as management station 1070 within the medical facility (see FIGS. 7 and 8).

In a present embodiment, the components comprising network connectivity module may be configured via an application stored as part of the uniform platform. In particular, a Java application licensed to a service engineer enables the engineer to configure the device connectivity at the diagnostic system to permit it to connect with the service facility.

Figure 10:
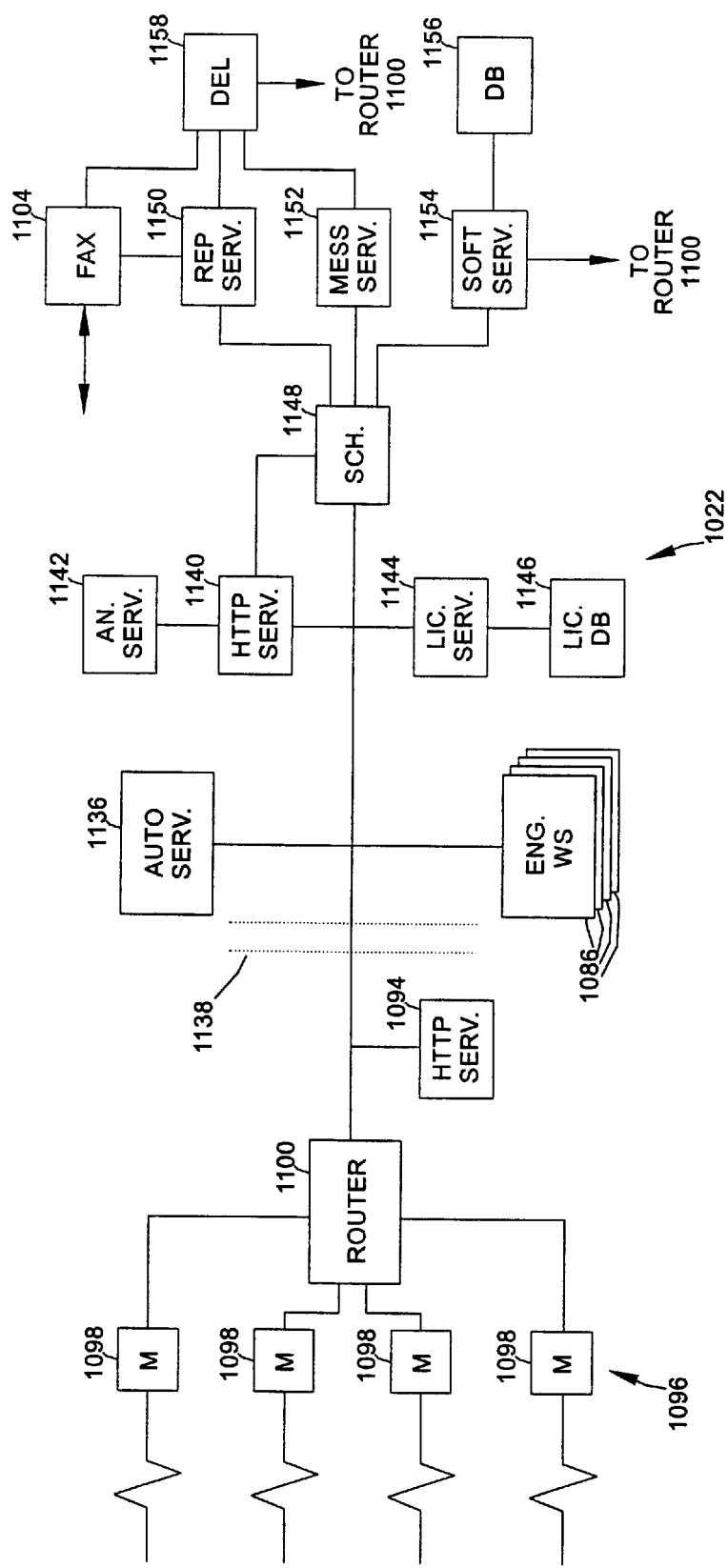
FIG. 10 is a block diagram of certain of the functional components of the service facility illustrated in FIGS. 7 and 8 for rendering interactive remote service to a plurality of medical diagnostic systems.

FIG. 10 illustrates exemplary functional components for service facility 1022. As indicated above, service facility 1022 includes a modem rack 1096 comprising a plurality of modems 1098 coupled to a router 1100 for coordinating data communications with the service facility. An HTTP service server 1094 receives and directs incoming and outgoing transactions with the facility. Server 1094 is coupled to the other components of the facility through a firewall 1138 for system security. Operator workstations 1086 are coupled to the port manager for handling service requests and transmitting messages and reports in response to such requests.

An automated service unit 1136 may also be included in the service facility for automatically responding to certain service requests, sweeping subscribing diagnostic systems for operational parameter data, and so forth, as described below. In a presently preferred embodiment, the automated service unit may operate independently of or in conjunction with the interactive service components comprising processing system 1084. It should be noted that other network or communications schemes may be provided for enabling the service facility to communicate and exchange data and messages with diagnostic systems and remote service units, such as systems including outside Internet service providers (ISP's), virtual private networks (VPN's) and so forth.

Behind firewall 1138, an HTTP application server 1140 coordinates handling of service requests, messaging, reporting, software transfers and so forth. Other servers may be coupled to HTTP server 1140, such as service analysis servers 1142 configured to address specific types of service requests, as described more fully below. In the illustrated embodiment, processing system 1084 also includes a license server 1144 which is coupled to a license database 1146 for storing, updating and verifying the status of diagnostic system service subscriptions. Alternatively, where desired, license server 1144 may be placed outside of fire wall 1138 to verify subscription status prior to admission to the service facility.

Handling of service requests, messaging, and reporting is further coordinated by a scheduler module 1148 coupled to HTTP server 1140. Scheduler module 1148 coordinates activities of other servers comprising the processing system, such as a report server 1150, a message server 1152, and a software download server 1154. As will be appreciated by those skilled in the art, servers 1150, 1152 and 1154 are coupled to memory devices (not shown) for storing data such as addresses, log files, message and report files, applications software, and so forth. In particular, as illustrated in FIG. 10, software server 1154 is coupled via one or more data channels to a storage device 1156 for containing transmittable software packages which may be sent directly to the diagnostic systems, accessed by the diagnostic systems, or supplied on pay-per-use or purchase basis. Message and report servers 1152 and 1154 are further coupled, along with communications module 1104, to a delivery handling module 1158, which is configured to receive outgoing messages, insure proper connectivity with diagnostic systems, and coordinate transmission of the messages.

In a presently preferred embodiment, the foregoing functional circuitry may be configured as hardware, firmware, or software on any appropriate computer platform. For example, the functional circuitry of the diagnostic systems may be programmed as appropriate code in a personnel computer or workstation either incorporated entirely in or added to the system scanner. The functional circuitry of the service facility may include additional personal computers or workstations, in addition to a main frame computer in which one or more of the servers, the scheduler, and so forth, are configured. Finally, the field service units may comprise personal computers or laptop computers of any suitable processor platform. It should also be noted that the foregoing functional circuitry may be adapted in a variety of manners for executing the functions described herein. In general, the functional circuitry facilitates the exchange of remote service data between the diagnostic systems and a remote service facility, which is preferably implemented in an interactive manner to provide regular updates to the diagnostic systems of service activities.

As described above, both the diagnostic systems and the field service units preferably facilitate interfacing between a variety of diagnostic system modalities and the remote service facility via a series of interactive user-viewable pages. Exemplary pages include capabilities of providing interactive information, composing service requests, selecting and transferring messages, reports and diagnostic system software, and so forth. Pages facilitate the interaction and use of remote services, such as, remote monitoring, remote system control, immediate file access from remote locations, remote file storage and archiving, remote resource pooling, remote recording, and remote high speed computations.

The user can access specific documents described in text areas of the pages by selection of all or a portion of the text describing the documents. In the presently preferred embodiment, the accessed documents may be stored in local memory devices within the diagnostic system, or selection of the text may result in loading of a uniform resource locator (URL) for accessing a remote computer or server via a network link.

Advantageously, ser vice system 1010 (FIG. 7) provides remote services, such as, remote diagnostics, remote control, and remote reconstruction. Service system 1010 incorporating the MRI system described with reference to FIG. 1 provides for the remote initiation of scans, the remote reconstruction of images, and the remote determination of fractional parameters used in fractional image acquisitions. In the latter case, service system 1010 allows databases at a remote facility to store information and data relating to the fractional part used in image data acquisition. For example, different fractional values may be used depending on what is being scanned or what is being looked for by the operator of the imaging device. Advantageously, large amounts of data on scanning parameters do not have to be stored at the imaging device. Further, the data may be changed and updated based on research and development, testing, and physician-requested or expert-required standards.

While the embodiments illustrated in the Figures and described above are presently preferred, it should be understood that the embodiments are offered by way of example only. Other embodiments may include further enhanced features made possible by the networked structures and functionalities described herein. The invention is not limited to a particular embodiment, but extends to various modifications, combinations, and permutations that nevertheless fall within the scope and spirit of the appended claims.

What is claimed is:

1. A method of MR imaging using fractional MRI acquisitions to reduce total acquisition time comprising the steps of:

obtaining a scan-specific partial MRI $k_x$ data set fraction and a scan-specific partial MRI $k_y$ data set fraction at a first location;

acquiring a partial MRI $k_x$ data set in k-space along a $k_x$ direction, the partial MRI $k_x$ data set containing a scan-specific partial MRI $k_x$ data set fraction amount of direction data;

acquiring a partial MRI $k_y$ data set in k-space along a $k_y$ direction, the partial MRI $k_y$ data set containing a scan-specific partial MRI $k_y$ data set fraction amount of direction data;

reconstructing an MR image using the partial MRI $k_x$ data set and the partial MRI $k_y$ data set; and transmitting information relating to the MR image between the first location and a second location remote from the first location.

2. The method of claim 1, further comprising remotely initiating an MR scan to acquire MRI data.

3. The method of claim 1, further comprising communicating the partial MRI $k_x$ data set and the partial MRI $k_y$ data set to a remote facility via a network, wherein the step of reconstructing an MR image is done at the remote facility.

4. The method of claim 1, wherein the scan-specific partial MRI $k_x$ data set fraction and the scan-specific partial MRI $k_y$ data set fraction are determined based on a subject being scanned.

5. The method of claim 1 wherein the step of reconstructing an MR image further comprises the steps of zero-filling missing data in the $k_x$ direction by using the acquired partial MRI $k_x$ data set.

6. The method of claim 5, wherein the step of zero-filling missing data is further defined as taking a Fourier transform of the acquired partial MRI $k_x$ data set to generate an image in an x direction which is a synthesized equivalent of a full x data set.

7. The method of claim 5, wherein the step of reconstructing an MR image further comprises the step of synthesizing missing data in the $k_y$ direction by using the acquired partial MRI $k_x$ data set, the acquired MRI $k_y$ data set, and the zero-filled missing data in the $k_x$ direction to acquire a full MRI $k_y$ data set.

8. The method of claim 7, wherein the steps of synthesizing missing data in the $k_y$ direction is further defined as applying a partial k-space reconstruction algorithm to the partial MRI $k_y$ data set to acquire a full MRI data set.

9. The method of claim 1, further comprising the step of shifting echo formation in a negative direction to reduce data points in the $k_x$ direction.

10. The method of claim 1, wherein approximately 80% of possible data in the $k_x$ direction is acquired and approximately 60% of possible data in the $k_y$ direction is acquired, and the step of reconstructing an MR image further comprises synthesizing missing $k_y$ data only after first zero-filling missing $k_x$ data.

11. The method of claim 1 further comprising the steps of acquiring a partial MRI $k_z$ data set in k-space along a $k_z$ direction, the partial MRI $k_z$ data set containing a fractional part of direction data as determined by values communicated from the remote facility via the network; and reconstructing an MR image using the partial MRI $k_x$ data set, the partial MRI $k_y$ data set, and the partial MRI $k_z$ data set.

12. The method of claim 11, wherein the step of reconstructing an MR image further comprises the steps of zero-filling missing data in at least two directions by using the acquired partial data sets to derive estimates of missing data in the at least two directions.

13. The method of claim 12, wherein the step of reconstructing an MR image further comprises the step of synthesizing missing data in a last direction by using zero-filled missing data and the acquired partial data sets to acquire a full MRI data set.

14. An MR data acquisition system designed to reduce total time in image acquisition comprising:

a magnetic resonance imaging system having a plurality of gradient coils positioned about a bore of a magnet to impress a polarizing magnetic field and a RF transceiver system and an RF modulator controlled by a pulse control module to transmit RF signals to an RF coil assembly to acquire MR images;

a network coupling the magnetic resonance imaging system to a remote facility and providing remote services to the magnetic resonance imaging system; and at least one computer coupled to the remote facility and the magnetic resonance imaging system and programmed to:

acquire a partial MR data set having data in a $k_x$ direction and data in a $k_y$ direction and having data missing in the $k_x$ direction and data missing in the $k_y$ direction based on fractional values provided by the remote facility via the network;

Fourier transform the partial MR data set in the $k_x$ direction to acquire an equivalent fall x data set in an x direction;

synthesize the partial MR data set in the $k_y$ direction using the equivalent full x data set to acquire an equivalent full x,y data set; and reconstruct an MR image using the equivalent full x,y data set.

15. The system of claim 14, wherein the computer is further programmed to assign zero-values to the partial MR data set in the $k_x$ direction where data is missing, wherein a resulting data set is equivalent to a complete $k_x$ data set multiplied by a step function defined by $u(k_x+k_{y0})$.

16. The system of claim 15, wherein the computer is further programmed to homodyne process the equivalent full x data set along the $k_y$ direction to acquire the equivalent full x,y data set.

17. The system of claim 14, wherein the partial MR data set is acquired based on a fractional amount of data provided by the remote facility via the network.

18. The system of claim 17, wherein the fractional amount of data is based on an object being sought in a subject being scanned.

19. The system of claim 14, wherein the data missing in the $k_x$ direction is approximately 20% of a complete $k_x$ data set and the data missing in the $k_y$ direction is approximately 40% of a complete $k_y$ data set.

20. The system of claim 14, wherein the computer is further programmed to:

acquire a partial MR data set having data in a $k_z$ direction and data missing in the $k_z$ direction; and Fourier transform the partial MR data set in the $k_z$ direction to acquire an equivalent full z data set in a z direction before synthesizing the partial MR data set in the $k_y$ direction; and reconstruct an MR image using the equivalent full x, y, z data set.

21. The system of claim 20, wherein the computer if further programmed to assign zero values to the partial MR data set in the $k_x$ direction and the $k_z$ direction where data is missing.

22. The system of claim 21, wherein the computer is further programmed to homodyne process the equivalent full x data set and the equivalent full z data set along the $k_y$ direction to acquire the equivalent full x, y, z data set.

23. An MRI system for minimizing data acquisition time comprising:

means for partially acquiring an MRI data set in both a $k_x$ direction and a $k_y$ direction based on fractional values provided at a first location;

means for interpolating the partial MRI data set into a complete $S(x,k_y)$ MRI data set in an x direction;

means for synthesizing the complete $S(x,k_y)$ data set in the $k_y$ direction into a complete x,y MRI data set;

means for reconstructing an MR image using the complete x,y MRI data set acquired with reduced acquisition time; and means for transmitting information relating to the MR image between the first location and a second location remote from the first location.

24. The system of claim 23, further comprising means for communicating the complete x,y MRI data set to a remote facility, wherein the reconstructing means is done at the remote facility.

25. The system of claim 23, wherein the means for interpolating further comprises means for zero-filling data by Fourier transforming the acquired partial MRI data set in the $k_x$ direction.

26. The system of claim 23, wherein the means for synthesizing further comprises means for homodyne processing the complete $S(x,k_y)$ MRI data set.

27. The system of claim 23, wherein the means for partially acquiring an MRI data set includes acquiring an 80% echo and a 60% NEX to reduce both echo time and total acquisition time while minimizing any blurring effects due to a reduced echo.

28. The system of claim 23, wherein the means for partially acquiring an MRI data set is further defined to partially acquire an MRI data set in a $k_z$ direction, and the means for interpolating is further defined to interpolate the partial MRI data set into a complete $S(x,k_y,z)$ MRI data set in an x and z direction and the means for synthesizing, further synthesizes the complete $S(x,k_y,z)$ data set in the $k_y$ direction into a complete x,y,z MRI data set and the means for reconstructing, further reconstructs an MR image using the complete x,y,z MRI data set.

* * * * *

UNITED STATES PATENT AND TRADEMARK OFFICE
CERTIFICATE OF CORRECTION

PATENT NO. : 6,351,122 B1  
DATED : February 26, 2002  
INVENTOR(S) : Polzin et al.

It is certified that error appears in the above-identified patent and that said Letters Patent is hereby corrected as shown below:

<u>Column 4,</u>
Line 19, delete "-$k_{y0}$ < $K_{ymax}$" and substitute therefor -- -$k_{y0}$ < $k_y$ < $K_{ymax}$ --;

<u>Column 13,</u>
Line 1, delete "ser vice" and substitute therefor -- service --;

<u>Column 14,</u>
Line 58, delete "fall" and substitute therefor -- full --.

Signed and Sealed this

Twentieth Day of August, 2002

Attest:

JAMES E. ROGAN
Attesting Officer   Director of the United States Patent and Trademark Office